(12) United States Patent
Zhang et al.

(10) Patent No.: US 10,879,352 B2
(45) Date of Patent: Dec. 29, 2020

(54) VERTICALLY STACKED NFETS AND PFETS WITH GATE-ALL-AROUND STRUCTURE

(71) Applicant: International Business Machines Corporation, Armonk, NY (US)

(72) Inventors: Jingyun Zhang, Albany, NY (US); Takashi Ando, Tuckahoe, NY (US); Pouya Hashemi, Purchase, NY (US); Choonghyun Lee, Rensselaer, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/448,873

(22) Filed: Jun. 21, 2019

(65) Prior Publication Data

US 2019/0319095 A1   Oct. 17, 2019

Related U.S. Application Data

(62) Division of application No. 15/802,067, filed on Nov. 2, 2017, now Pat. No. 10,381,438.

(51) Int. Cl.
*H01L 29/06* (2006.01)
*H01L 29/423* (2006.01)
(Continued)

(52) U.S. Cl.
CPC .... *H01L 29/0673* (2013.01); *H01L 21/02112* (2013.01); *H01L 21/02164* (2013.01);
(Continued)

(58) Field of Classification Search
CPC ......... H01L 21/8221; H01L 21/823878; H01L 21/823814; H01L 21/02164; H01L 21/02236; H01L 21/02112; H01L 21/30605; H01L 21/02532; H01L 21/823871; H01L 21/823842; H01L 21/823807; H01L 21/02255; H01L 21/31116; H01L 29/0673; H01L 29/78651;
(Continued)

(56) References Cited

U.S. PATENT DOCUMENTS 9,354,408 B2   5/2016   Noma et al.
9,659,963 B2   5/2017   Cheng et al.
(Continued)

OTHER PUBLICATIONS

List of IBM Patents or Patent Applications Treated as Related dated Jun. 21, 2019, 2 pages.

*Primary Examiner* — Galina G Yushina
(74) *Attorney, Agent, or Firm* — Scully, Scott, Murphy & Presser, P.C.; L. Jeffrey Kelly, Esq.

(57) ABSTRACT

A semiconductor structure including vertically stacked n-type field effect transistors (nFETs) and p-type field effect transistors (pFETs) containing suspended semiconductor channel material nanosheets having an isolation layer located between a pFET source/drain (S/D) structure and an nFET S/D region is provided together with a method of forming such a structure. The pFET S/D structure includes a pFET S/D SiGe region having a first germanium content and an overlying SiGe region having a second germanium content that is greater than the first germanium content.

20 Claims, 15 Drawing Sheets

(51) Int. Cl.

| | |
|---|---|
| *H01L 29/08* | (2006.01) |
| *H01L 29/165* | (2006.01) |
| *H01L 21/02* | (2006.01) |
| *H01L 21/306* | (2006.01) |
| *H01L 27/12* | (2006.01) |
| *H01L 27/092* | (2006.01) |
| *H01L 21/8238* | (2006.01) |
| *H01L 29/66* | (2006.01) |
| *H01L 21/84* | (2006.01) |
| *H01L 29/10* | (2006.01) |
| *H01L 29/786* | (2006.01) |
| *H01L 27/06* | (2006.01) |
| *H01L 21/822* | (2006.01) |
| *H01L 21/311* | (2006.01) |

(52) U.S. Cl.
CPC .. *H01L 21/02236* (2013.01); *H01L 21/02532* (2013.01); *H01L 21/30604* (2013.01); *H01L 21/8221* (2013.01); *H01L 21/823807* (2013.01); *H01L 21/823814* (2013.01); *H01L 21/823828* (2013.01); *H01L 21/823878* (2013.01); *H01L 21/84* (2013.01); *H01L 27/0688* (2013.01); *H01L 27/092* (2013.01); *H01L 27/1203* (2013.01); *H01L 29/0653* (2013.01); *H01L 29/0847* (2013.01); *H01L 29/1037* (2013.01); *H01L 29/165* (2013.01); *H01L 29/42392* (2013.01); *H01L 29/66545* (2013.01); *H01L 29/66553* (2013.01); *H01L 29/66742* (2013.01); *H01L 29/78651* (2013.01); *H01L 29/78684* (2013.01); *H01L 21/02255* (2013.01); *H01L 21/31116* (2013.01); *H01L 21/823842* (2013.01); *H01L 21/823871* (2013.01)

(58) Field of Classification Search
CPC ......... H01L 29/78684; H01L 29/66742; H01L 29/66545; H01L 29/165; H01L 29/0653; H01L 29/0847; H01L 29/42392; H01L 27/0688; H01L 27/092; H01L 27/1203
See application file for complete search history.

(56) References Cited

U.S. PATENT DOCUMENTS

| | | |
|---|---|---|
| 9,837,414 B1 | 12/2017 | Balakrishnan et al. |
| 2011/0147815 A1 | 6/2011 | Takeda |
| 2014/0131660 A1 | 5/2014 | Cea et al. |
| 2015/0021696 A1 | 1/2015 | Sung et al. |
| 2015/0263088 A1 | 9/2015 | Cheng et al. |
| 2016/0027929 A1 | 1/2016 | Cheng et al. |
| 2016/0141366 A1 | 5/2016 | Lai et al. |
| 2017/0033182 A1* | 2/2017 | Cheng ............... H01L 21/02612 |
| 2017/0040321 A1* | 2/2017 | Mitard .............. H01L 29/78696 |
| 2017/0069763 A1 | 3/2017 | Doris et al. |
| 2017/0133507 A1 | 5/2017 | Cheng et al. |
| 2017/0148922 A1 | 5/2017 | Hatcher et al. |
| 2017/0263728 A1 | 9/2017 | Kittl et al. |
| 2018/0374753 A1 | 12/2018 | Pawlak et al. |

* cited by examiner

VERTICALLY STACKED NFETS AND PFETS WITH GATE-ALL-AROUND STRUCTURE

BACKGROUND

The present application relates to a semiconductor structure and a method of forming the same. More particularly, the present application relates to a semiconductor structure including vertically stacked n-type field effect transistors (nFETs) and p-type field effect transistors (pFETs), each containing a gate-all-around structure, and a method of forming the same.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Also, three dimensional (3D) integration by vertically stacking nFETs and pFETs is an attractive approach for 3 nm node and beyond area scaling. Such vertically stacking of nFETs and pFETs combined with nanosheet technology can benefit from device electrostatics control in addition to area scaling. One problem associated with prior art devices that contain a combination of vertically stacked nFETs and pFETs and nanosheet technology is that there is a need for providing sufficient isolation between the nFET S/D regions and the pFET S/D regions of such vertically stacked nFETs and pFETs. In addition to the isolation issue mentioned above, independent work functional control for vertically stacked nFETs and pFETs is not possible.

There is thus a need for providing a method that combines vertically stacked nFETs and pFETs and nanosheet technology that has improved isolation between the nFET S/D regions and the pFET S/D regions of such vertically stacked nFETs and pFETs, and, in some cases, implements independent work function metal gates for the nFETs and pFETs.

SUMMARY

A semiconductor structure including vertically stacked nFETs and pFETs containing suspended semiconductor channel material nanosheets having an isolation layer located between a pFET S/D structure and an nFET S/D region is provided together with a method of forming such a structure. The pFET S/D structure includes a pFET S/D SiGe region having a first germanium content and an overlying SiGe region having a second germanium content that is greater than the first germanium content.

In one aspect of the present application, a semiconductor structure is provided. In one embodiment, the semiconductor structure includes a pFET device comprising a first functional gate structure present on physically exposed surfaces, and between, each semiconductor channel material nanosheet of a first set of vertically stacked and suspended semiconductor channel material nanosheets, and a pFET S/D structure present on each side of the first set of vertically stacked and suspended semiconductor channel material nanosheets. The pFET S/D structure includes a stack of a pFET S/D SiGe region having a first germanium content and a SiGe region having a second germanium content greater than the first germanium content. The semiconductor structure further includes an nFET device stacked vertically above the pFET device. The nFET device includes a second functional gate structure present on physically exposed surfaces, and between, each semiconductor channel material nanosheet of a second set of vertically stacked and suspended semiconductor channel material nanosheets, and an nFET S/D region present on each side of the second set of vertically stacked and suspended semiconductor channel material nanosheets and located above each pFET S/D structure. A silicon dioxide layer is present between each SiGe region of the pFET S/D structure and the nFET S/D region.

In another aspect of the present application, a method of forming a semiconductor structure is provided. In one embodiment, the method includes forming a vertical stack of a first nanosheet stack of alternating nanosheets of a sacrificial semiconductor nanosheet and a semiconductor channel material nanosheet, and a second nanosheet stack of alternating nanosheets of a sacrificial semiconductor nanosheet and a semiconductor channel material nanosheet, wherein the vertical stack is present above a semiconductor substrate and beneath a sacrificial gate structure and a dielectric spacer. Next, each sacrificial semiconductor nanosheet of the first and second nanosheet stacks is recessed. Next, a pFET S/D SiGe region having a first germanium content is formed on physically exposed sidewalls of each semiconductor channel material nanosheet of the first nanosheet stack. A germanium oxide layer is then formed on at least physically exposed surfaces of each pFET S/D SiGe region. Next, a condensation anneal is performed to convert an upper portion of each pFET S/D SiGe region into a SiGe region having a second germanium content that is greater than the first germanium content, wherein the germanium oxide layer located on each pFET S/D SiGe region is simultaneously converted into a silicon dioxide layer. An nFET S/D region is then formed on physically exposed sidewalls of each semiconductor channel material nanosheet of the second nanosheet stack and on the silicon dioxide layer. The sacrificial gate structure and each recessed sacrificial semiconductor nanosheet of the first and second nanosheet stacks are then removed to suspend each semiconductor channel material nanosheet and to provide a gate cavity. A first functional gate structure is formed in the gate cavity and on physically exposed surfaces of each suspended semiconductor channel material nanosheet of the first nanosheet stack, and forming second functional gate structure is formed in the gate cavity and on physically exposed surfaces of each suspended semiconductor channel material nanosheet of the second nanosheet stack.

DETAILED DESCRIPTION

Figure 1:
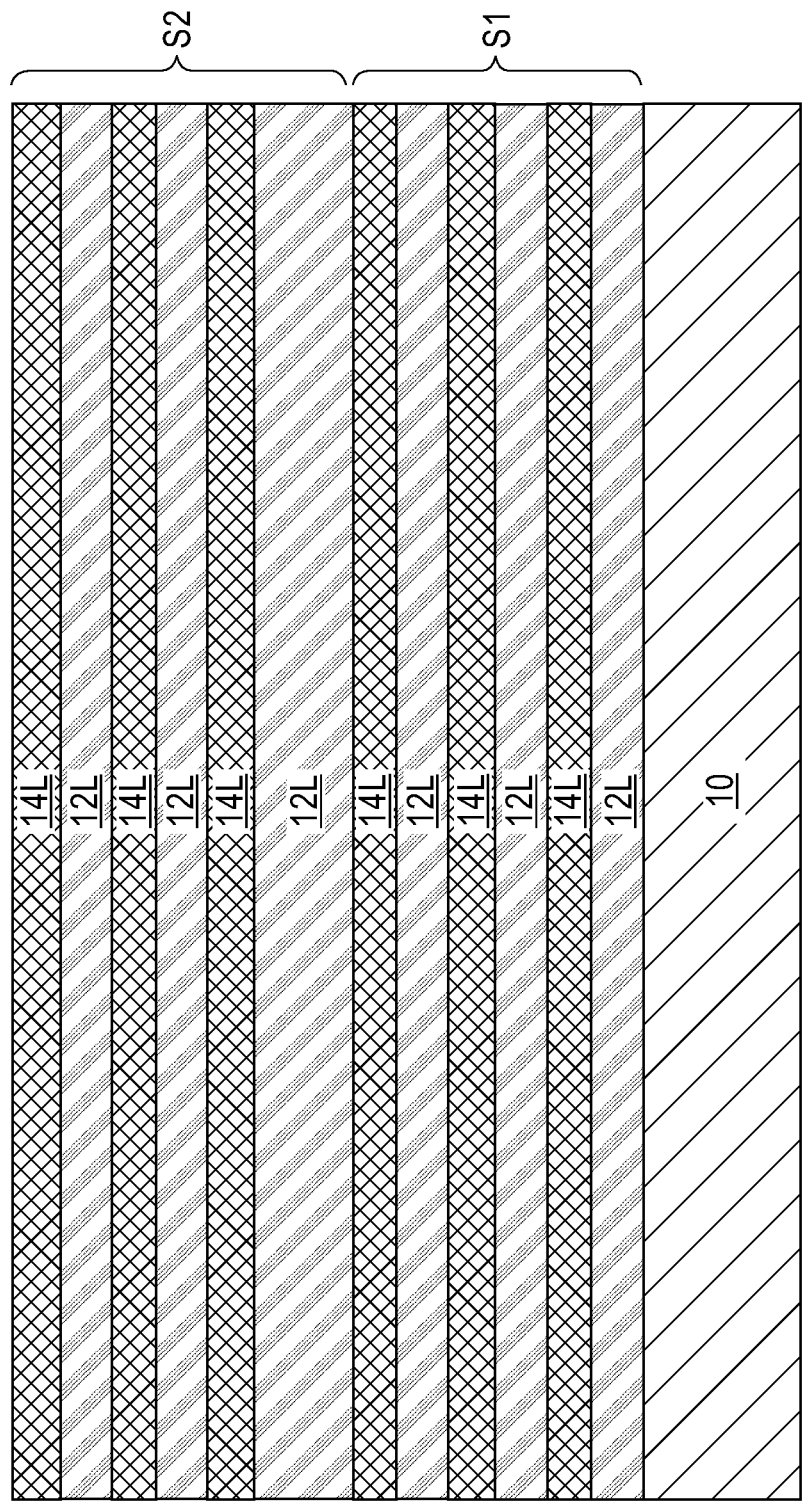
FIG. 1 is a cross sectional view of an exemplary semiconductor structure at an early stage of fabrication in accordance with an embodiment of the present application and including a first semiconductor material stack of alternating layers of a sacrificial semiconductor material layer and a semiconductor channel material layer, and a second semiconductor material stack of alternating layers of a sacrificial semiconductor material layer and a semiconductor channel material layer, wherein the first semiconductor material stack is located on a topmost surface of a semiconductor substrate, and the second semiconductor material stack is located on a topmost surface of the first semiconductor material stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated an exemplary semiconductor structure at an early stage of fabrication in accordance with an embodiment of the present application. Notably, the exemplary semiconductor structure of FIG. 1 includes a first semiconductor material stack, S1, of alternating layers of a sacrificial semiconductor material layer 12L and a semiconductor channel material layer 14L, and a second semiconductor material stack, S2, of alternating layers of a sacrificial semiconductor material layer 12L and a semiconductor channel material layer 14L, wherein the first semiconductor material stack, S1, is located on a topmost surface of a semiconductor substrate 10, and the second semiconductor material stack, S2, is located on a topmost surface of the first semiconductor material stack, S1.

In the present application, the first semiconductor material stack, S1, is used in providing vertically stacked and suspended semiconductor channel material nanosheets for a pFET device, while the second semiconductor material stack, S2, is used in providing vertically stacked and suspended semiconductor channel material nanosheets for an nFET device.

The semiconductor substrate 10 may include any semiconductor material including, for example, silicon. The term "semiconductor material" is used throughout the present application to denote a material that has semiconducting properties. Besides silicon, the semiconductor material may be germanium (Ge), a silicon germanium alloy (SiGe), silicon carbide (SiC), silicon germanium carbide (SiGeC), III-V compound semiconductors or II-VI compound semiconductors.

The first and second semiconductor material stacks (S1, S2) are then sequentially formed upon the semiconductor substrate 10. As mentioned above, the first and second semiconductor material stacks (S1, S2) include sacrificial semiconductor material layers 12L and semiconductor channel material layers 14L which alternate one atop the other. In FIG. 1 and by way of one example, each of the first and second semiconductor material stacks (S1, S2) includes three sacrificial semiconductor material layers 12L and three semiconductor channel material layers 14L. The first and second semiconductor material stacks (S1, S2) that can be employed in the present application are not limited to the specific embodiment illustrated in FIG. 1. Instead, the first and second semiconductor material stacks (S1, S2) can include any number of sacrificial semiconductor material layers 12L and corresponding semiconductor channel material layers 14L so long as each of the first and second semiconductor material stacks (S1, S2) includes at least two sacrificial semiconductor material layers 12L and two semiconductor channel material layers 14L.

Each sacrificial semiconductor material layer 12L is composed of a first semiconductor material which differs in composition from at least an upper portion of the semiconductor substrate 10, and is resistant to Ge condensation as described herein. In one embodiment, the upper portion of the semiconductor substrate 10 is composed of silicon, while each sacrificial semiconductor material layer 12L is composed of a silicon germanium alloy. In such an embodiment, the SiGe alloy that provides each sacrificial semiconductor material layer 12L has a germanium content that is less than 50 atomic percent germanium. In one example, the SiGe alloy that provides each sacrificial semiconductor material layer 12L has a germanium content from 20 atomic percent germanium to 40 atomic percent germanium. The first semiconductor material that provides each sacrificial semiconductor material layer 12L can be formed utilizing an epitaxial growth (or deposition process) as defined in greater detail herein below.

Each semiconductor channel material layer 14L is composed of a second semiconductor material that has a different etch rate than the first semiconductor material that provides the sacrificial semiconductor material layers 12L, and is also resistant to Ge condensation. The second semiconductor material that provides each semiconductor channel material layer 14L may be the same as, or different from, the semiconductor material that provides at least the upper portion of the semiconductor substrate 10. The second semiconductor material can be a SiGe alloy provided that the SiGe alloy has a germanium content that is less than 50 atomic percent germanium, and that the first semiconductor material is different from the second semiconductor material.

In one example, at least the upper portion of the semiconductor substrate 10 and each semiconductor channel material layer 14L is composed of Si or a III-V compound semiconductor, while each sacrificial semiconductor material layer 12L is composed of a silicon germanium alloy. The second semiconductor material that provides each semiconductor channel material layer 14L can be formed utilizing an epitaxial growth (or deposition process) as defined in greater detail herein below.

The first and second semiconductor material stacks (S1, S2) can be formed by sequential epitaxial growth of alternating layers of the first semiconductor material and the second semiconductor material. Following epitaxial growth of the topmost layer of the second semiconductor material stack, S2, a patterning process may be used to provide the first and second semiconductor material stacks (S1, S2) shown in FIG. 1. Patterning may be achieved by lithography and etching as is well known to those skilled in the art.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growths described herein can be performed utilizing any well known precursor gas or gas mixture. Carrier gases like hydrogen, nitrogen, helium and argon can be used.

Each sacrificial semiconductor material layer 12L may have a thickness from 6 nm to 12 nm, while each semiconductor channel material layer 14L may have a thickness from 5 to 12 nm. In the present application, the bottommost sacrificial semiconductor material layer 12L in the second semiconductor material stack, S2, has a thickness that is generally greater than the thickness of the other sacrificial semiconductor material layers within the first and second semiconductor material stacks (S1, S2). By providing a thick sacrificial semiconductor material layer at the bottommost layer of the second semiconductor material stack, S2, sufficient isolation can be provided between the subsequently formed vertically stacked pFET and nFET device regions.

Figure 2:
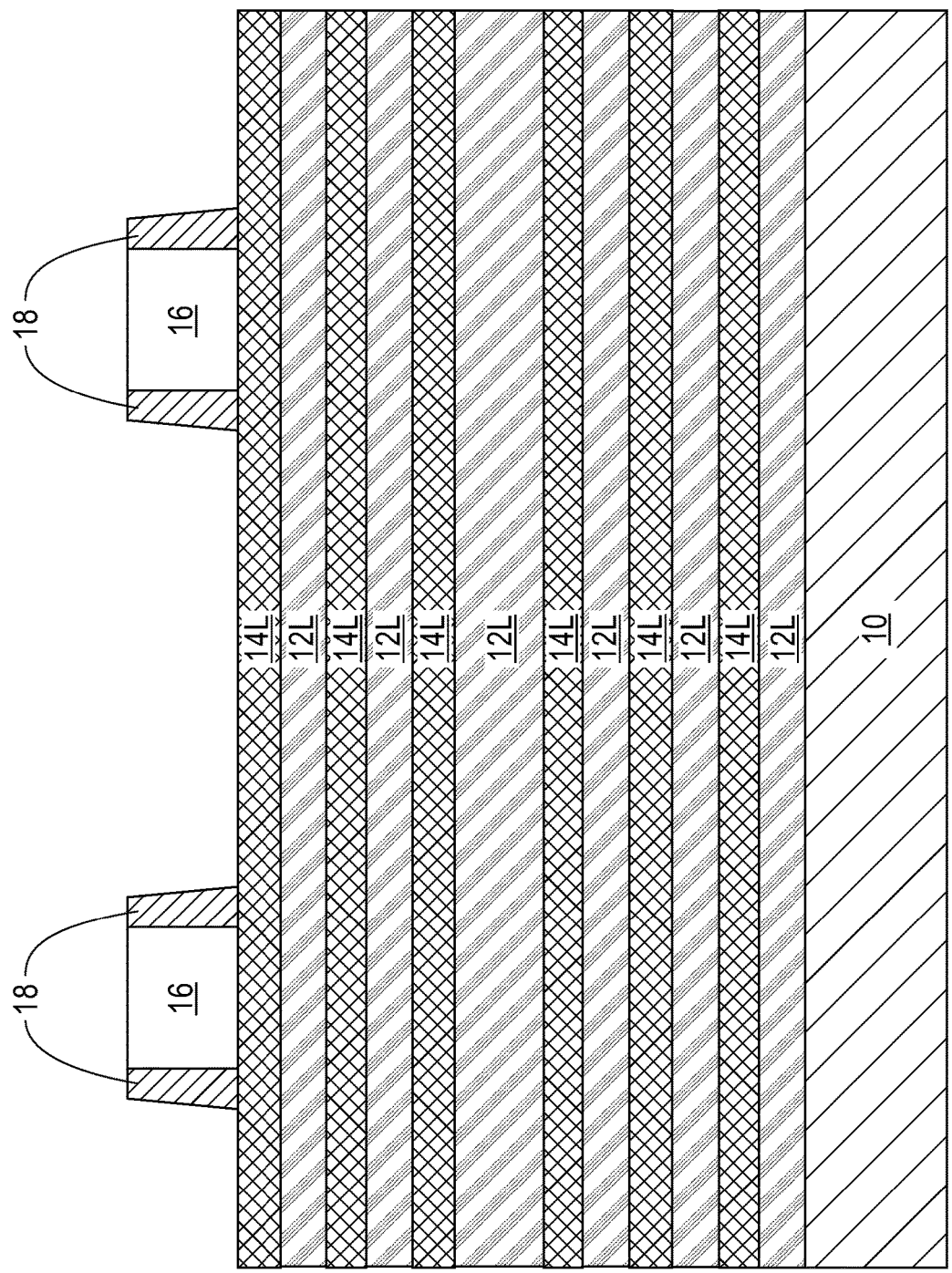
FIG. 2 is a cross sectional view of the exemplary semiconductor structure of FIG. 1 after forming at least one sacrificial gate structure and a dielectric spacer.

Referring now to FIG. 2, there is illustrated the exemplary semiconductor structure of FIG. 1 after forming at least one sacrificial gate structure 16 and a dielectric spacer 18. By way of illustration, two sacrificial gate structures 16 are exemplified in the drawings of the present application. Although not shown, each sacrificial gate structure 16 is located on a first side and a second side of the first and second semiconductor material stacks (S1, S2) and spans across a topmost surface of a portion of the second semiconductor material stack, S2. Each sacrificial gate stack 16 thus straddles over a portion of the first and second semiconductor material stacks (S1, S2). The dielectric spacer layer 18 is present on sidewalls of each sacrificial gate structure 16; the dielectric spacer 18 also straddles over the first and second semiconductor material stacks (S1, S2).

It is noted that in the drawings of the present application, the sacrificial gate structures 16 and dielectric spacer 18 are only shown as being present atop, not along sidewalls, of the first and second semiconductor material stacks (S1, S2). This was done for clarity and to illustrate the nanosheet stacks that are formed beneath the sacrificial gate structures 16 and the dielectric spacer 18.

Each sacrificial gate structure 16 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the at least one sacrificial gate structure 16. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 16, the dielectric spacer 18 can be formed. The dielectric spacer 18 can be formed by first providing a dielectric spacer material and then etching the dielectric spacer material. One example of a dielectric spacer material that may be employed in the present application is silicon nitride or silicon dioxide.

The dielectric spacer material that provides the dielectric spacer 18 may be provided by a deposition process including, for example, chemical vapor deposition (CVD), plasma enhanced chemical vapor deposition (PECVD), or physical vapor deposition (PVD). The etch used to provide the dielectric spacer 18 may comprise a dry etching process such as, for example, reactive ion etching.

Figure 3:
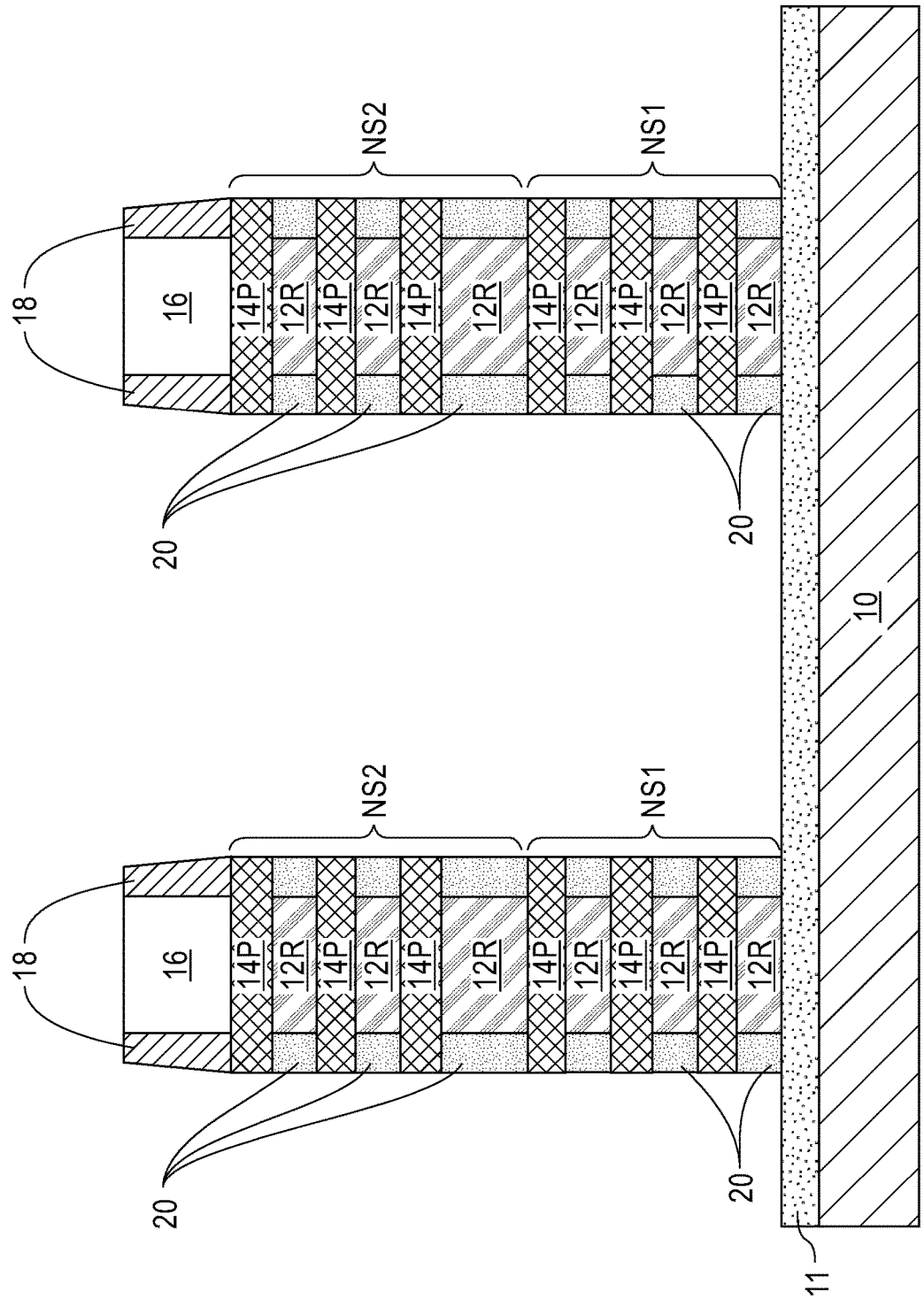
FIG. 3 is a cross sectional view of the exemplary semiconductor structure of FIG. 2 after forming a first nanosheet stack of alternating nanosheets of a sacrificial semiconductor material nanosheet and a semiconductor channel material nanosheet, and a second nanosheet stack of alternating nanosheets of a sacrificial semiconductor material nanosheet and a semiconductor channel material nanosheet under the least one sacrificial gate structure and the dielectric spacer by removing physically exposed portions of the first and second semiconductor material stacks that are not protected by the least one sacrificial gate structure and the dielectric spacer, recessing each sacrificial semiconductor material nanosheet, forming an inner spacer within a gap formed by the recessing of each sacrificial semiconductor material nanosheet, and forming a dielectric isolation layer.

Referring now to FIG. 3, there is illustrated the exemplary semiconductor structure of FIG. 2 after forming a first nanosheet stack, NS1, and a second nanosheet stack, NS2, under the least one sacrificial gate structure 16 and the dielectric spacer 18, recessing each sacrificial semiconductor material nanosheet to form recessed sacrificial semiconductor material nanosheets 12R, forming an inner spacer 20 within a gap formed by the recessing of each sacrificial semiconductor material nanosheet, and forming a dielectric isolation layer 11.

The first and second first nanosheet stacks (NS1, NS2) can be formed by removing physically exposed portions of the first and second semiconductor material stacks (S1, S2) that are not protected by the least one sacrificial gate structure 16 and the dielectric spacer 18. The removal of the portions of the first and second semiconductor material stacks (S1, S2) not covered by the least one sacrificial gate structure 16 and the dielectric spacer 18 can be performed utilizing an anisotropic etching process such as, for example, reactive ion etching (RIE). Portions of the first and second semiconductor material stacks (S1, S2) remain beneath the least one sacrificial gate structure 16 and the dielectric spacer 18. The remaining portion of the first semiconductor material stack, S1, which is present beneath the least one sacrificial gate structure 16 and the dielectric spacer material layer 18, is referred to as a first nanosheet stack, NS1. The remaining portion of the second semiconductor material stack, S2, that is present beneath the least one sacrificial gate structure 16 and the dielectric spacer material layer 18 and atop the first nanosheet stack, NS1, is referred to as a second nanosheet stack, NS2.

The first and second nanosheet stacks (NS1, NS2) include alternating nanosheets of remaining portions of each sacrificial semiconductor material layer (referred to herein as sacrificial semiconductor material nanosheets) and remaining portions of each semiconductor channel material layer (referred to herein as semiconductor channel material nanosheets 14P); the sacrificial semiconductor material nanosheets are not specifically labeled since they will be subsequently recessed to provide recessed sacrificial semiconductor material nanosheets 12R.

Each nanosheet, i.e., sacrificial semiconductor material nanosheet and semiconductor channel material nanosheet 14P, that constitutes the first and second nanosheet stacks (NS1, NS2) has a thickness as mentioned above for the individual sacrificial semiconductor material layers 12L and semiconductor channel material layers 14L, and a width from 30 nm to 200 nm. At this point of the present application, the sidewalls of each sacrificial semiconductor material nanosheet are vertically aligned to sidewalls of each semiconductor channel material nanosheet 14P, and the vertically aligned sidewalls of the first and second nanosheet stacks (NS1, NS2) are vertically aligned to an outermost sidewall of the dielectric spacer 18.

Next, and as also shown in FIG. 3, each sacrificial semiconductor material nanosheet within the first and second nanosheet stacks (NS1, NS2) is recessed to provide a recessed sacrificial semiconductor material nanosheet 12R. Each recessed sacrificial semiconductor material nanosheet 12R has a width that is less than the original width of each sacrificial semiconductor material nanosheet. The recessing of each sacrificial semiconductor material nanosheet provides a gap (not specifically shown) between each neighboring pair of semiconductor channel material nanosheets 14P within a given first and second nanosheet stacks (NS1, NS2). The recessing of each sacrificial semiconductor material nanosheet may be performed utilizing a lateral etching process that is selective in removing physically exposed end portions of each sacrificial semiconductor material nanosheet relative to each semiconductor channel material nanosheet 14P.

An inner spacer 20, as shown in FIG. 3, is formed into each gap created by the recessing of each sacrificial semiconductor material nanosheet. The inner spacer 20 may be formed by deposition of a dielectric spacer material and etching such as, for example, RIE. The dielectric spacer material that provides the inner spacer 20 may be the same as, or different from, the dielectric spacer material that provides dielectric spacer 18. The inner spacers 20 have an inner sidewall that directly contacts a sidewall of one of the recessed sacrificial semiconductor material nanosheet 12R, and an outer sidewall that is vertically aligned to an outer sidewall of each semiconductor channel material nanosheet 14P.

Dielectric isolation layer 11 can then be formed. Dielectric isolation layer 11 may be formed by etching an upper portion of the semiconductor substrate 10 and thereafter depositing a dielectric material such as, for example, silicon dioxide. An etch back process may follow the deposition of the dielectric material that provides the dielectric isolation layer 11. Dielectric isolation layer 11 is present between the first nanosheet stack, NS1, and a remaining portion of the semiconductor substrate 10. During the etching of the upper portion of the semiconductor substrate 10, the first and second nanosheet stacks (NS1, NS2) are anchored by the sacrificial gate structure 16 and the dielectric spacer 18.

Figure 4:
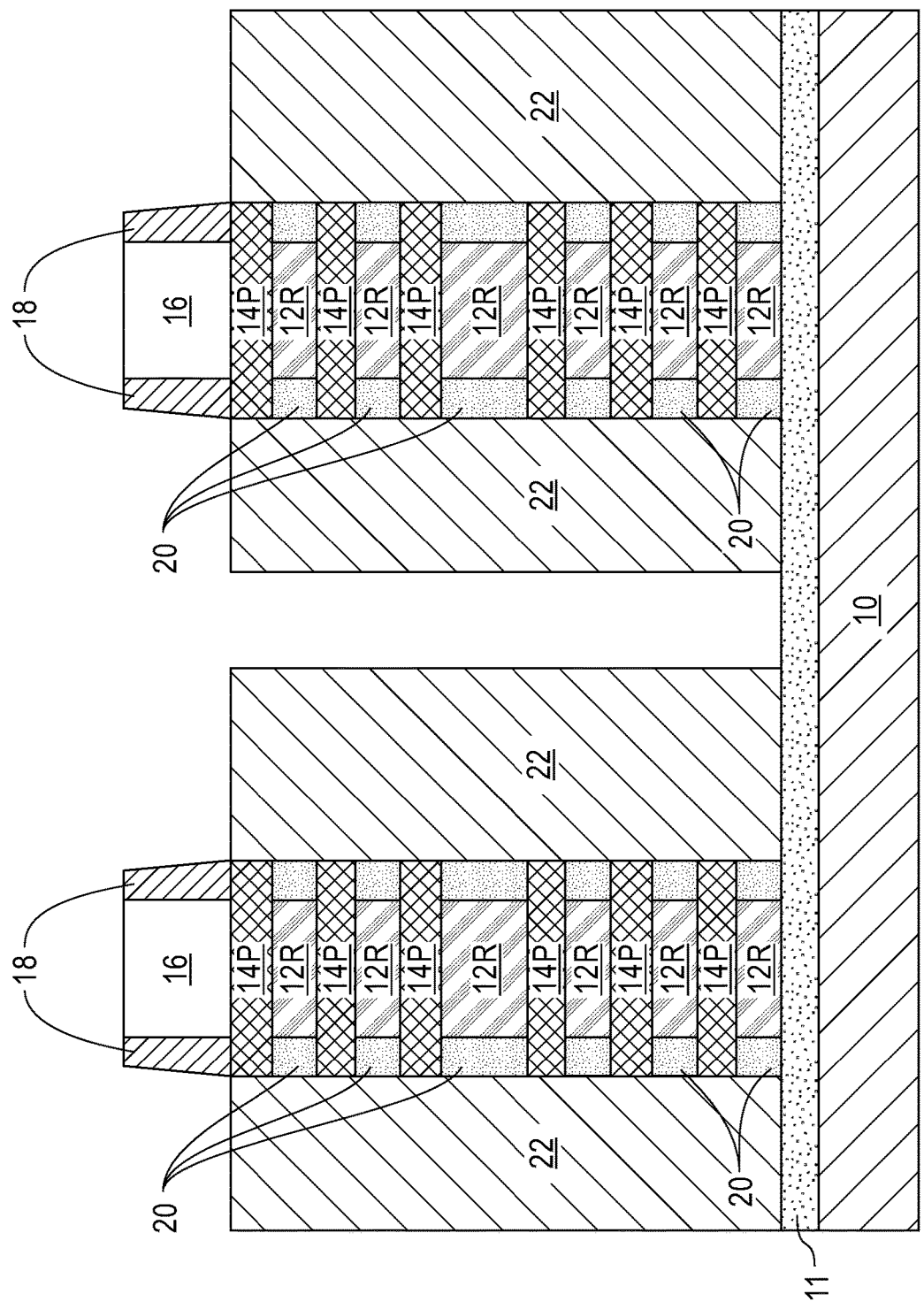
FIG. 4 is a cross sectional view of the exemplary semiconductor structure of FIG. 3 after forming a pFET S/D silicon germanium (SiGe) material having a first germanium content by epitaxial growth on physically exposed sidewalls of each semiconductor channel material nanosheet.

Referring now to FIG. 4, there is illustrated the exemplary semiconductor structure of FIG. 3 after forming a pFET S/D silicon germanium (SiGe) material 22 having a first germanium content by epitaxial growth on physically exposed sidewalls of each semiconductor channel material nanosheet 14P. In the present application, the pFET S/D silicon germanium (SiGe) material 22 grows laterally out from the sidewalls of each semiconductor channel material nanosheet 14P. No bottom up growth is observed due to the presence of the dielectric isolation structure 11.

The pFET S/D silicon germanium (SiGe) material 22 is formed on each side of the first and second nanosheet stacks (NS1, NS2). The pFET S/D silicon germanium (SiGe) semiconductor material 22 includes a SiGe alloy having the first germanium content and a p-type dopant. The first germanium content of the SiGe alloy that provides each pFET S/D silicon germanium (SiGe) material 22 is greater than any germanium content that may be present in both the recessed sacrificial semiconductor material nanosheets 12R and the semiconductor channel material nanosheets 14P. In one embodiment, the first germanium content of the SiGe alloy that provides each pFET S/D silicon germanium (SiGe) material 22 is from 50 atomic percent germanium or greater, with a range from 50 atomic percent germanium to 60 atomic percent atomic percent germanium being typical.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. In one embodiment, the p-type dopant that can be present in the pFET S/D silicon germanium (SiGe) material 22 can be introduced into the precursor gas that provides the pFET S/D silicon germanium (SiGe) material 22. In another embodiment, the dopant can be introduced into an intrinsic semiconductor layer by utilizing one of ion implantation or gas phase doping. In one example, the pFET S/D silicon germanium (SiGe) material 22 includes silicon germanium that is doped with boron (i.e., B doped SiGe). As mentioned above, each pFET S/D silicon germanium (SiGe) material 22 is formed by an epitaxial growth (or deposition) process, as is defined above.

Figure 5:
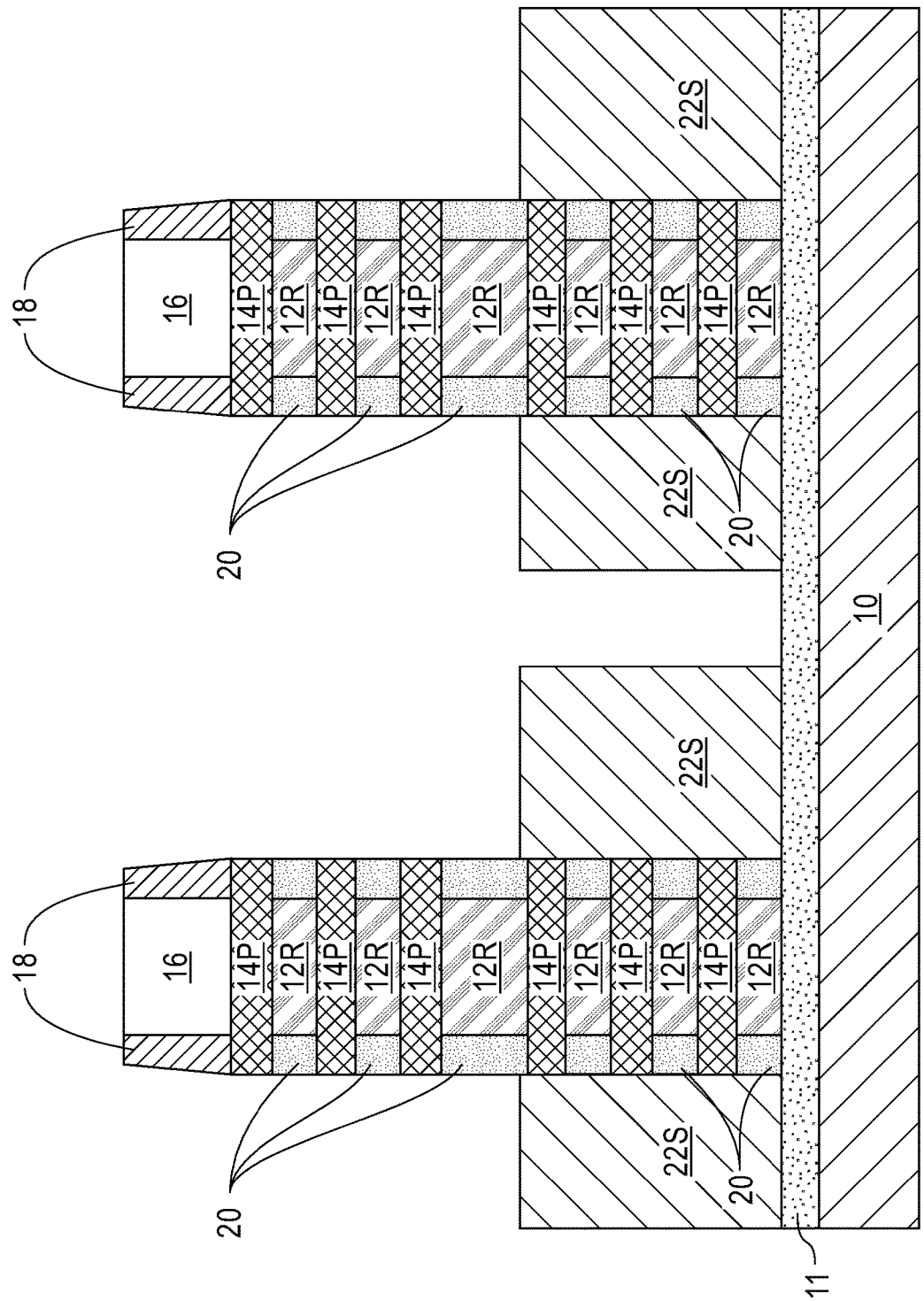
FIG. 5 is a cross sectional view of the exemplary semiconductor structure of FIG. 4 after removing the pFET S/D silicon germanium (SiGe) material from the sidewalls of each semiconductor channel material nanosheet in the second nanosheet stack, while maintaining the pFET S/D silicon germanium (SiGe) material on the sidewalls of each semiconductor channel material nanosheet of the first nanosheet stack.

Referring now to FIG. 5, there is illustrated the exemplary semiconductor structure of FIG. 4 after removing the pFET S/D silicon germanium (SiGe) material 22 from the sidewalls of each semiconductor channel material nanosheet 14P in the second nanosheet stack, NS2, while maintaining the pFET S/D silicon germanium (SiGe) material 22 on sidewalls of each semiconductor channel material nanosheet 14P of the first nanosheet stack, S1. The remaining portion of the pFET S/D silicon germanium (SiGe) material 22 can be referred to herein as a pFET S/D SiGe region 22S.

The removal of the pFET S/D silicon germanium (SiGe) material 22 from the sidewalls of each semiconductor channel material nanosheet 14P in the second nanosheet stack, NS2, can be performed utilizing a recess etching process that is selective for removing pFET S/D silicon germanium (SiGe) material 22. The height of each pFET S/D SiGe region 22S is above a topmost surface of the topmost semiconductor channel material nanosheet 14P of the first nanosheet stack, NS1, and beneath a topmost surface of the bottommost recessed sacrificial semiconductor material nanosheet 12R in the second nanosheet stack, NS2.

Figure 6:
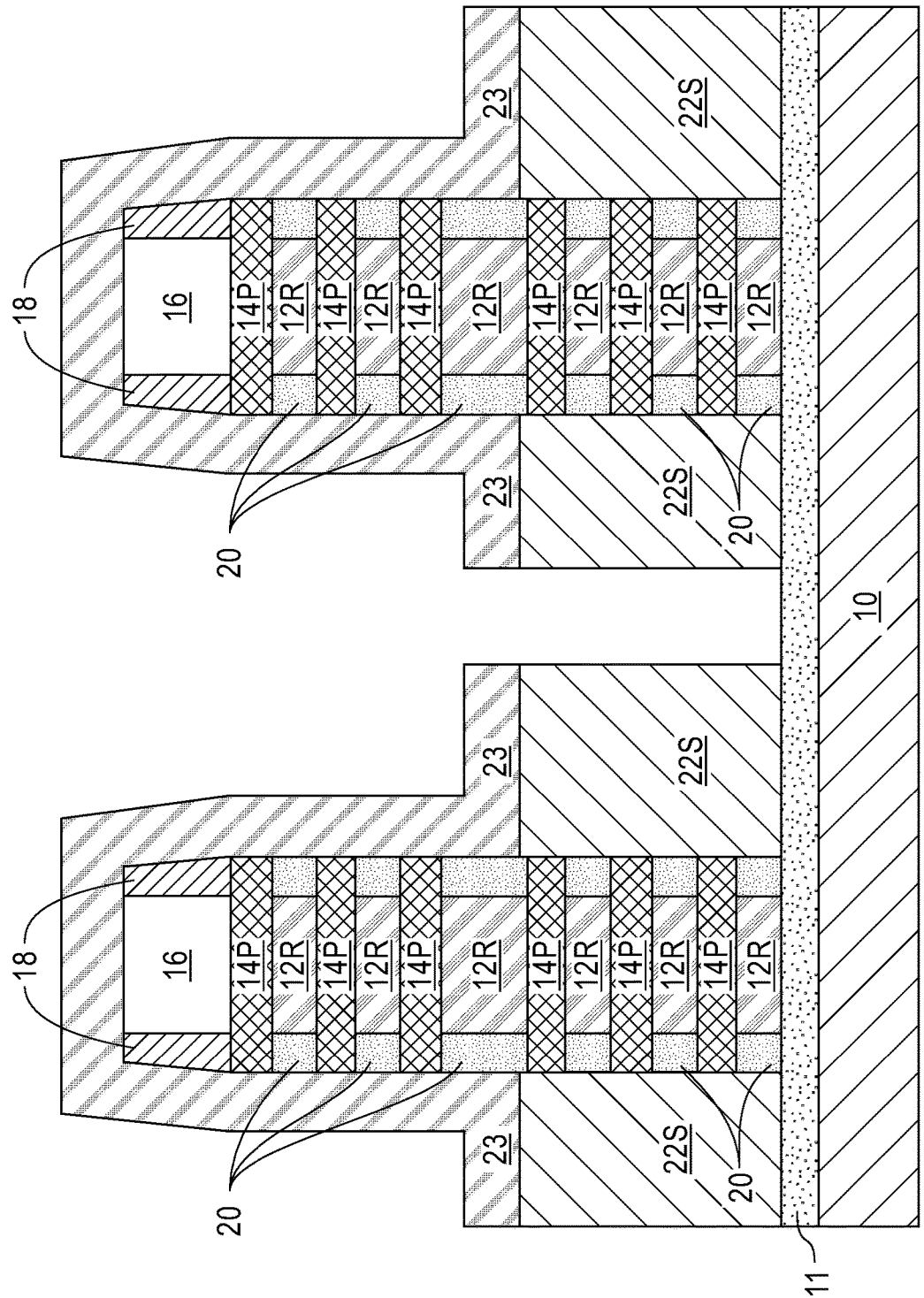
FIG. 6 is a cross sectional view of the exemplary semiconductor structure of FIG. 5 after forming a germanium oxide layer.

Referring now to FIG. 6, there is illustrated the exemplary semiconductor structure of FIG. 5 after forming a germanium oxide layer 23. As is shown, the germanium oxide layer 23 is formed on a physically exposed topmost surface of each pFET S/D SiGe region 22S, along sidewalls of inner spacers 20, semiconductor channel material 14P, and dielectric spacer 18 and atop the sacrificial gate structure 16.

The germanium oxide layer 23 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, germanium oxide layer 23 can have a thickness in a range from 5 nm to 25 nm. Other thicknesses that are lesser than, or greater than, the aforementioned thickness range can also be employed for the germanium oxide layer 23.

Figure 7:
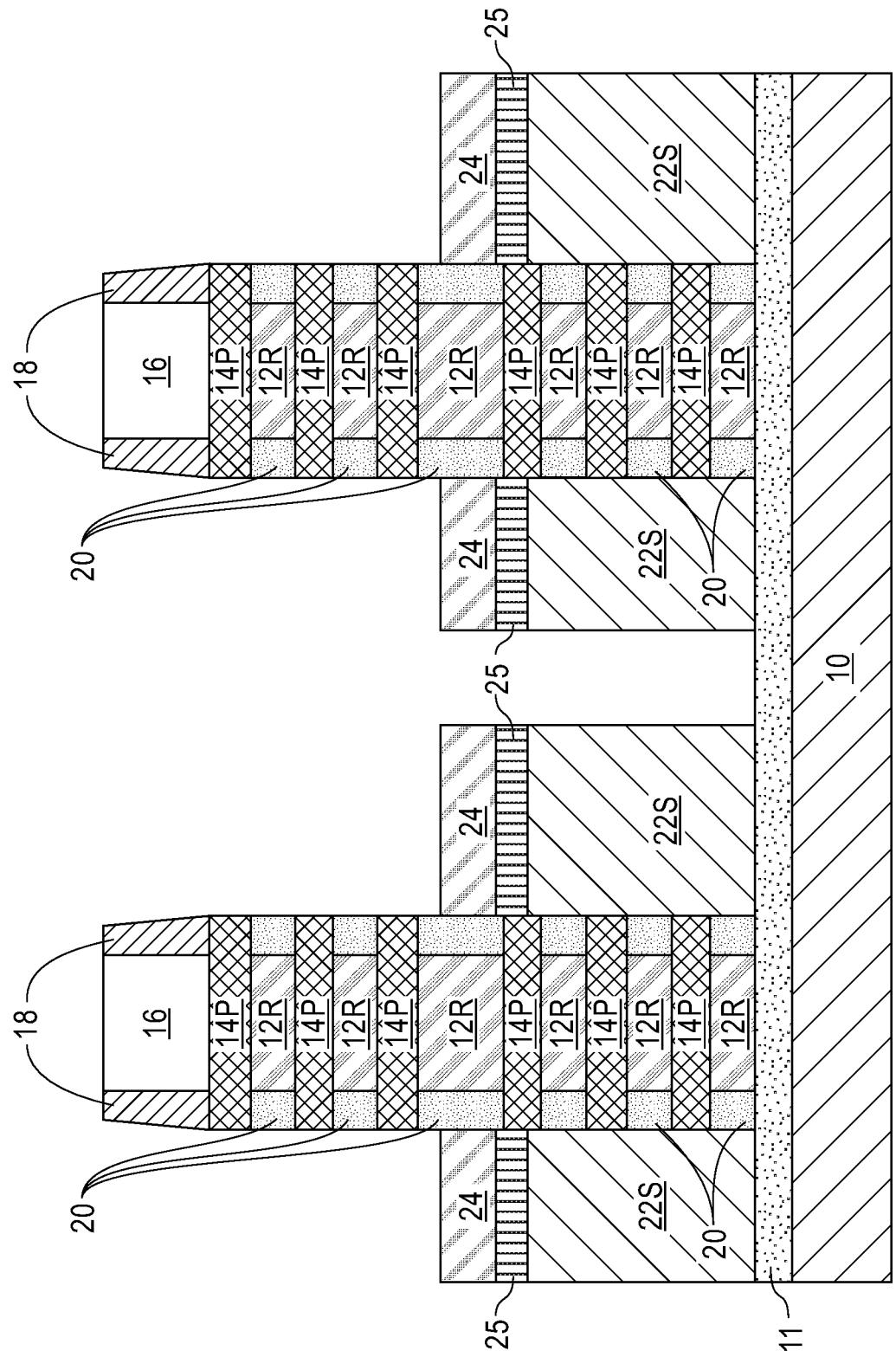
FIG. 7 is a cross sectional view of the exemplary semiconductor structure of FIG. 6 after performing a condensation anneal to convert an upper portion of the maintained pFET S/D silicon germanium (SiGe) material that is in physical contact with the germanium oxide layer into a SiGe region having a second germanium content that is greater than the first germanium content, and removing any non-reacted germanium oxide.

Referring now FIG. 7, there is illustrated the exemplary semiconductor structure of FIG. 6 after performing a condensation anneal to convert an upper portion of the maintained pFET S/D silicon germanium (SiGe) material (i.e., the pFET S/D SiGe regions 22S) that is in physical contact with the germanium oxide layer 23 into a SiGe region 25 having a second germanium content that is greater than the first germanium content. In one example, the second germanium content can be from 55 atomic percent germanium to 75 atomic percent germanium. No condensation of the semiconductor channel material nanosheets 14P or the recessed sacrificial semiconductor material nanosheets 12R occurs. Collectively, each pFET S/D SiGe region 22S and the SiGe region 25 that is located thereon may be referred to herein as a pFET S/D structure.

During this conversion step, the germanium oxide layer 23 that is in physically contact with the pFET S/D SiGe regions 22S is also converted into a silicon dioxide layer 24. The silicon dioxide layer 24 is formed directly on the SiGe region 25, and is located between a topmost surface and a bottommost surface of the bottommost recessed sacrificial semiconductor material nanosheet 12R of the second nanosheet stack, NS2. The silicon dioxide layer 24 provides an isolation layer between the vertically stacked nFET S/D structure (22S, 25) and a subsequently formed pFET S/D region 26S (See FIG. 8).

The condensation anneal is performed at low temperature (i.e., a temperature of less than 800° C., the lower temperature limit of the condensation anneal is about 350° C.) and in an inert ambient such as, for example, helium, argon, and/or nitrogen. In one example, the condensation anneal is a spike anneal that is performed at a temperature of about 700° C. in a nitrogen ambient.

The unreacted germanium oxide can be removed utilizing deionized water or any other etchant that can selectively remove germanium oxide.

Figure 8:
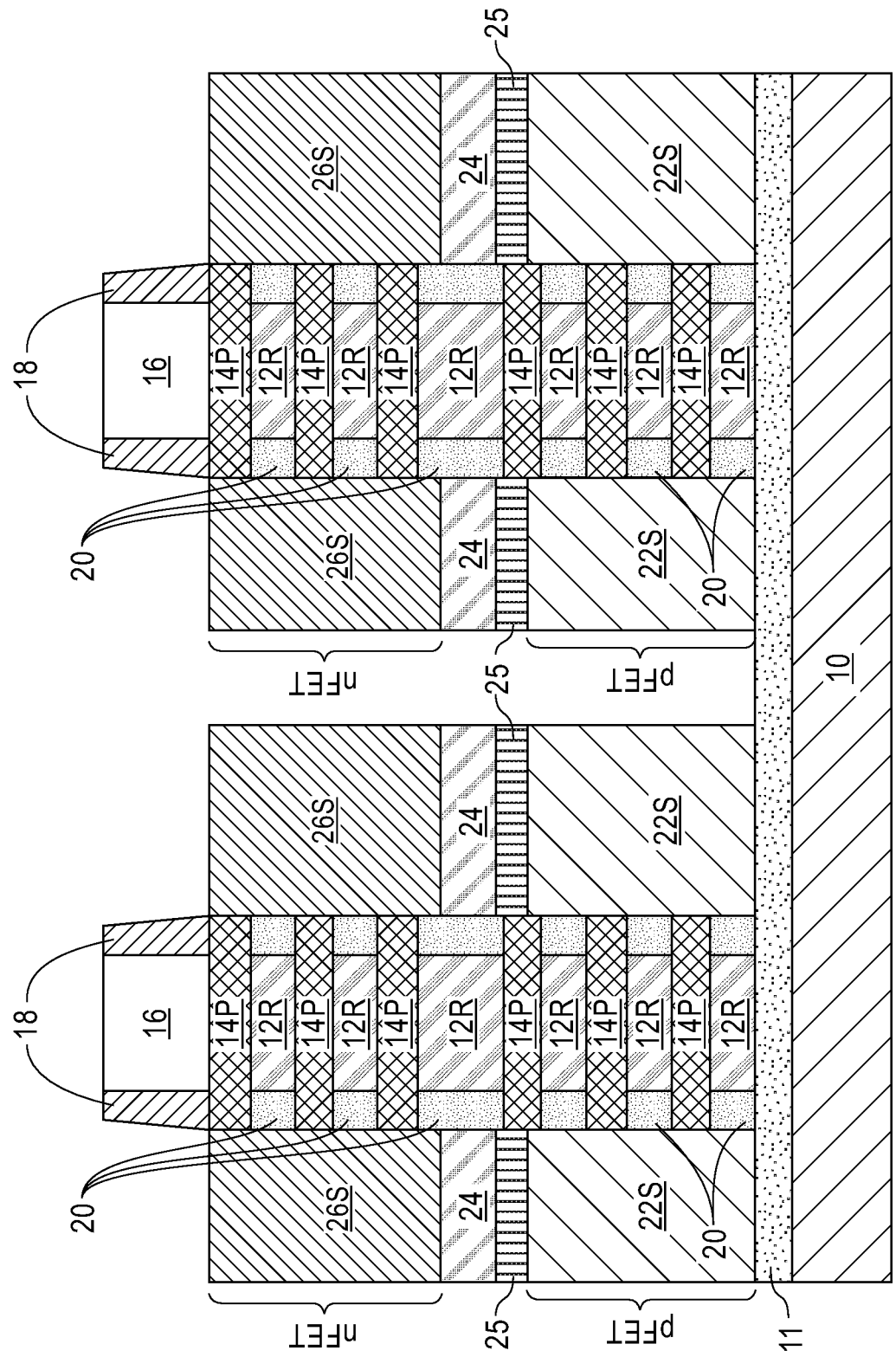
FIG. 8 is a cross sectional view of the exemplary semiconductor structure of FIG. 7 after forming an nFET S/D region by epitaxial growth of a semiconductor material on physically exposed sidewalls of each semiconductor channel material nanosheet of the second nanosheet stack and atop a silicon dioxide layer that forms on the SiGe region formed during the conversion step.

Referring now to FIG. 8, there is illustrated the exemplary semiconductor structure of FIG. 7 after forming an nFET S/D region 26S by epitaxial growth of a semiconductor material on physically exposed sidewalls of each semiconductor channel material nanosheet 14P of the second nanosheet stack, NS2, and atop the silicon dioxide layer 24 that forms on the SiGe region 25 formed during the conversion step mentioned above.

Each nFET S/D region 26S includes a semiconductor material and an n-type dopant. The semiconductor material that provides each nFET S/D region 26S typically comprises a same semiconductor material as that which provides each semiconductor channel material nanosheet 14P.

The term "n-type dopant" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each nFET S/D region 26S can be introduced into the precursor gas that provides each nFET S/D region 26S. In another embodiment, the dopant can be introduced into an intrinsic semiconductor layer by utilizing one of ion implantation or gas phase doping. In one example, each nFET S/D region 26S comprises silicon that is doped with phosphorus (i.e., P doped Si). As mentioned above, each nFET S/D region 26S is formed by an epitaxial growth (or deposition) process, as is defined above.

The height of the nFET S/D regions 26S may be above, coplanar with, or beneath a topmost surface of the topmost semiconductor channel material nanosheet 14P of the second nanosheet stack, NS2, but not lower than the bottommost surface of the topmost semiconductor channel material nanosheet 14P of the second nanosheet stack, NS2.

Figure 9A:
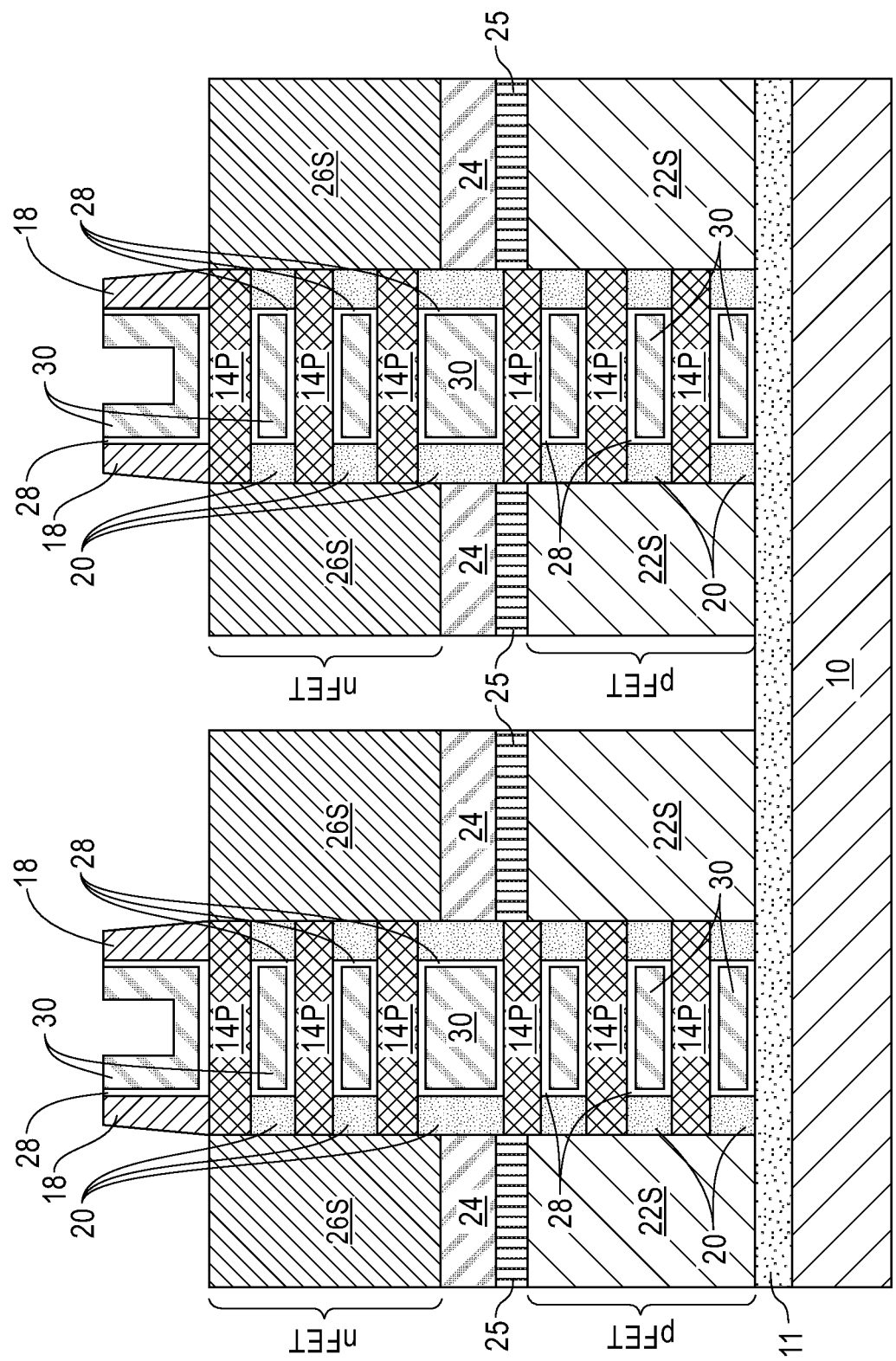
FIG. 9A is a cross sectional view of the exemplary semiconductor structure of FIG. 8 after removing each sacrificial gate structure and each sacrificial SiGe nanosheet, and forming a gate dielectric material and a single work function metal-containing material.

Referring now to FIG. 9A, there is illustrated the exemplary semiconductor structure of FIG. 8 after removing each sacrificial gate structure 16 and each recessed sacrificial semiconductor material nanosheet 12R, and forming a gate dielectric material 28 and a single work function metal-containing material 30 in accordance with one embodiment of the present application.

The sacrificial gate structure 16 can be removed utilizing one or more anisotropic etching processes that are selective in removing the materials that provide the sacrificial gate structure 16. Next, each semiconductor channel material nanosheet 14P is suspended by selectively etching each recessed sacrificial semiconductor material nanosheet 12R relative to the semiconductor channel material nanosheet 14P. A gate cavity is formed by removing the sacrificial gate structure 16 and each recessed sacrificial semiconductor nanosheet 12R. The gate cavity is present above, beneath and around each suspended semiconductor channel material nanosheet 14P. Vertically stacked and suspended semiconductor channel material nanosheets 14P of the second nanosheet stack, NS2, are provided and define an nFET device region, while vertically stacked and suspended semiconductor channel material nanosheets 14P of the first nanosheet stack, NS1, are provided and to define a pFET device region.

A gate dielectric material 28 is then formed into gate cavity. The gate dielectric material 28 is present on physically exposed surfaces of each semiconductor channel material nanosheet 14P. The gate dielectric material 28 is also present on inner sidewalls of the dielectric spacer 18 and the inner spacers 20. The gate dielectric material 28 does not occupy the entire volume of the gate cavity.

The gate dielectric material 28 can be an oxide, nitride, and/or oxynitride. In one example, the gate dielectric material 28 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-k gate dielectric, can be formed and used as the gate dielectric 28.

The gate dielectric material 28 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material 28 can have a thickness in a range from 1 nm to 10 nm. Other thicknesses that are lesser than, or greater than, the aforementioned thickness range can also be employed for the gate dielectric material 28.

Next, a work function metal-containing material 30 (i.e., a single work function metal-containing material) is formed on the gate dielectric material 28 in both the nFET device region and the pFET device region. In one embodiment, the work function metal-containing material 30 is an n-type work function metal-containing material. Illustrative n-type work function metal-containing materials that may be employed include hafnium, zirconium, titanium, tantalum, aluminum, metal carbides (e.g., hafnium carbide, zirconium carbide, titanium carbide, and aluminum carbide), aluminides, or any combination thereof. In one embodiment, the n-type work function metal-containing material that may be employed includes a material stack of TiN/Al-containing alloy/TiN.

In another embodiment, the work function metal-containing material 30 is a p-type work function metal-containing material. Illustrative p-type work function metal-containing materials that may be employed include ruthenium, palladium, platinum, cobalt, nickel, and conductive metal oxides, or any combination thereof.

The work function metal-containing material 30 can be formed utilizing a deposition process such as, for example, CVD, PECVD or ALD.

FIG. 9A represents one exemplary semiconductor structure of the present application. Notably, FIG. 9A illustrates a semiconductor structure that includes a pFET device comprising a first functional gate structure (28, 30) present on physically exposed surfaces, and between, each semiconductor channel material nanosheet 14P of a first set of vertically stacked and suspended semiconductor channel material nanosheets, and a pFET S/D structure (22S, 25) present on each side of the first set of vertically stacked and suspended semiconductor channel material nanosheets. The pFET S/D structure includes a stack of a pFET S/D SiGe region 22S having a first germanium content and a SiGe region 25 having a second germanium content greater than the first germanium content. The semiconductor structure further includes an nFET device stacked vertically above the pFET device. The nFET device includes a second functional gate structure (28, 30) present on physically exposed surfaces, and between, each semiconductor channel material nanosheet 14P of a second set of vertically stacked and suspended semiconductor channel material nanosheets, and an nFET S/D region 26S present on each side of the second set of vertically stacked and suspended semiconductor channel material nanosheets and located above each pFET S/D structure 22S, 25). A silicon dioxide layer 24 is present between each SiGe region 25 of the pFET S/D structure and the nFET S/D region 26S. In this embodiment, the first and second functional gate structures have a single work function metal-containing material 30.

Figure 9B:
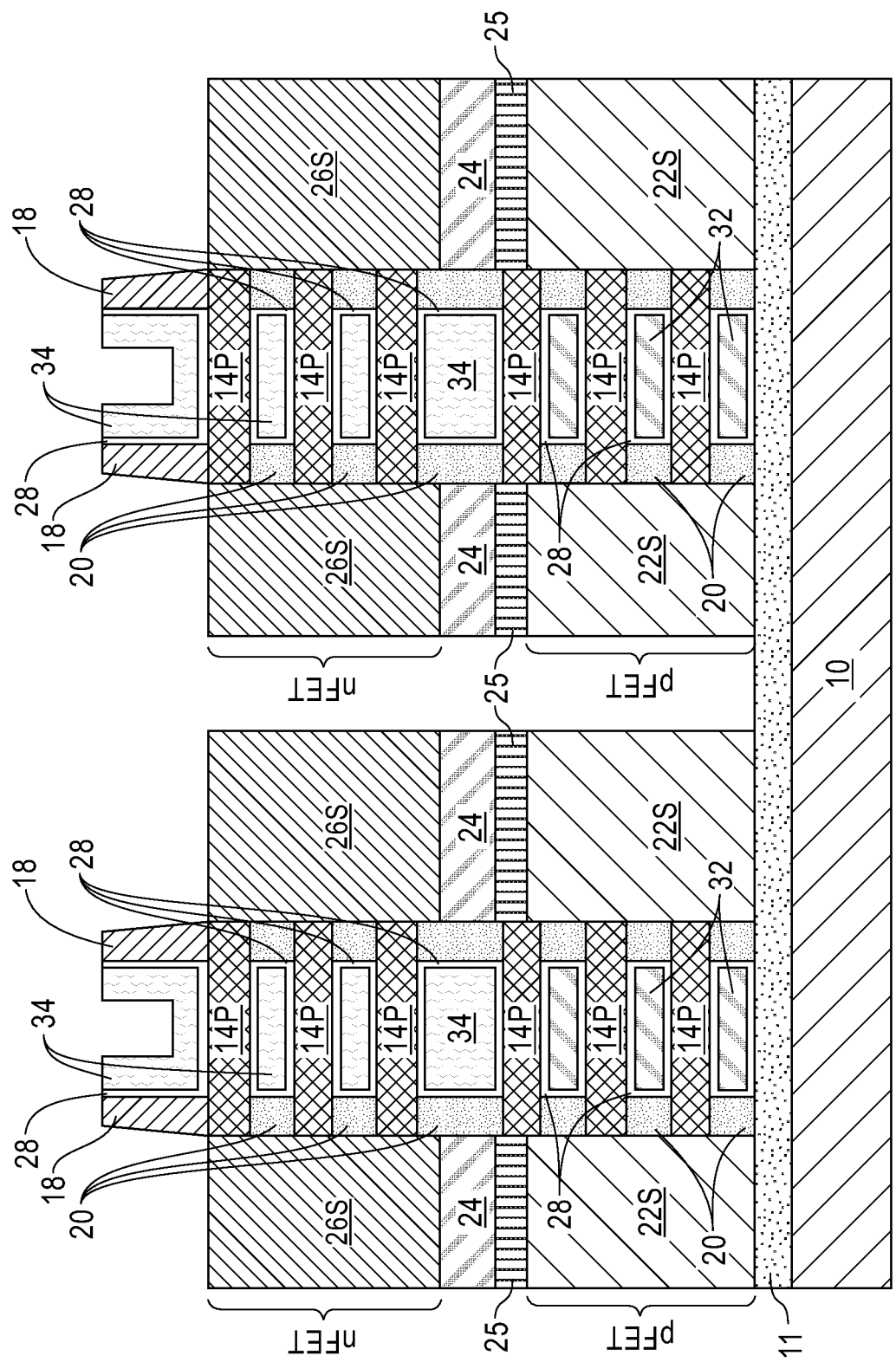
FIG. 9B is a cross sectional view of the exemplary semiconductor structure of FIG. 8 after removing each sacrificial gate structure and each sacrificial SiGe nanosheet, and forming a gate dielectric material and dual work function metal-containing materials.

Referring now to FIG. 9B, there is illustrated the exemplary semiconductor structure of FIG. 8 after removing each sacrificial gate structure 16 and each recessed sacrificial SiGe nanosheet 12R, and forming a gate dielectric material 28 and dual work function metal-containing materials. The dual work function metal-containing materials include a p-type work function metal-containing material 32 present in the pFET device region and an n-type work function metal-containing material 34 present in the pFET device region.

The exemplary semiconductor structure shown in FIG. 9B can be made by first providing the exemplary semiconductor structure shown in FIG. 8. Next, each sacrificial gate structure 16 and each recessed sacrificial semiconductor material nanosheet 12R are removed to provide a gate cavity. The sacrificial gate structure 16 and each recessed sacrificial semiconductor material nanosheet 12R can be removed utilizing the processes mentioned above for providing the exemplary semiconductor structure shown in FIG. 9A. Gate dielectric material 28, as defined above, is then formed into the gate cavity and on exposed surfaces of the each suspended semiconductor channel material nanosheet 14P.

Next, a p-type work function metal-containing material 32 is formed on the gate dielectric material 28 in the gate cavity in both device regions The p-type work function metal-containing material 32 does not occupy the entire volume of the gate cavity.

The p-type work function metal-containing material 32 that is employed may include any of the p-type work function metal-containing materials mentioned above for work function metal-containing material 30. Alternatively, the p-type work function metal-containing material 32 is a metal nitride stack of ALD TiN and CVD TiN. In such an embodiment, the ALD TiN (typically thickness from 0.2 nm to 2 nm) is formed first on exposed surfaces of the gate dielectric material 28 followed by the CVD nitride (typically thickness from 1 nm to 3 nm). The CVD nitride encapsulates each semiconductor channel material nanosheet 14P and forms a seam (not specifically shown) between each of the semiconductor channel material nanosheets 14P. This seam enables the subsequent removal of TiN from the semiconductor channel material nanosheets 14P within the second nanosheet stack, NS2, with a small wet etching budget. This seam may remain in the pFET device region.

Next, the p-type work function metal-containing material 32 is removed from each semiconductor channel material nanosheet 14P of the second nanosheet stack, NS2. The removal of the p-type work function metal-containing material 32 from each semiconductor channel material nanosheet 14P of the second nanosheet stack, NS2 can be performed utilizing a wet etch process in which a chemical etchant that is selective in removing the p-type work function metal-containing material 32 can be used.

In some embodiments, a sacrificial material (not shown) such as, for example, an organic planarization material, is formed first filling in any vertical trenches between different vertically stacked device regions, and then the sacrificial material is recessed to the top of silicon dioxide layer 24. Next, the removal of the p-type work function metal-containing material 32 from each semiconductor channel material nanosheet 14P of the second nanosheet stack, NS2, can be performed. After the removal of the p-type work function metal-containing material 32 from each semiconductor channel material nanosheet 14P of the second nanosheet stack, NS2, the sacrificial material may be removed from the structure.

Next, an n-type work function metal-containing material 34 is formed in the gate cavity in the nFET device region. The n-type work function metal-containing material 34 warps around each semiconductor channel material nanosheet 14P of the second nanosheet stack, NS2, and fills a remaining volume of the gate cavity that is positioned between vertically stacked semiconductor channel material nanosheets 14P of the second nanosheet stack, NS2. No n-type work function metal-containing material 34 is formed in the pFET device region containing the vertically stacked and suspended semiconductor channel material nanosheets 14P of the first nanosheet stack, NS1, and the p-type work function metal-containing material 32.

The n-type work function metal-containing material 34 may include hafnium, zirconium, titanium, tantalum, aluminum, metal carbides (e.g., hafnium carbide, zirconium carbide, titanium carbide, and aluminum carbide), aluminides, or any combination thereof. In one embodiment, the n-type work function metal-containing material 32 may include a material stack of TiN/Al-containing alloy/TiN. The n-type work function metal-containing material 34 can be formed utilizing a deposition process such as, for example, CVD, PECVD or ALD. The n-type work function metal-containing material 34 typically has a thickness from 1 nm to 10 nm.

FIG. 9B represents another exemplary semiconductor structure of the present application. Notably, FIG. 9B illustrates a semiconductor structure that includes a pFET device comprising a first functional gate structure (28, 32) present on physically exposed surfaces, and between, each semiconductor channel material nanosheet 14P of a first set of vertically stacked and suspended semiconductor channel material nanosheets, and a pFET S/D structure (22S, 25) present on each side of the first set of vertically stacked and suspended semiconductor channel material nanosheets. The pFET S/D structure includes a stack of a pFET S/D SiGe region 22S having a first germanium content and a SiGe region 25 having a second germanium content greater than the first germanium content. The semiconductor structure further includes an nFET device stacked vertically above the pFET device. The nFET device includes a second functional gate structure (28, 34) present on physically exposed surfaces, and between, each semiconductor channel material nanosheet 14P of a second set of vertically stacked and suspended semiconductor channel material nanosheets, and an nFET S/D region 26S present on each side of the second set of vertically stacked and suspended semiconductor channel material nanosheets and located above each pFET S/D structure 22S, 25). A silicon dioxide layer 24 is present between each SiGe region 25 of the pFET S/D structure and the nFET S/D region 26S. In this embodiment, the first functional gate structure includes a p-type work function metal, while the second functional gate structure includes a n-type work function metal 34.

Figure 10:
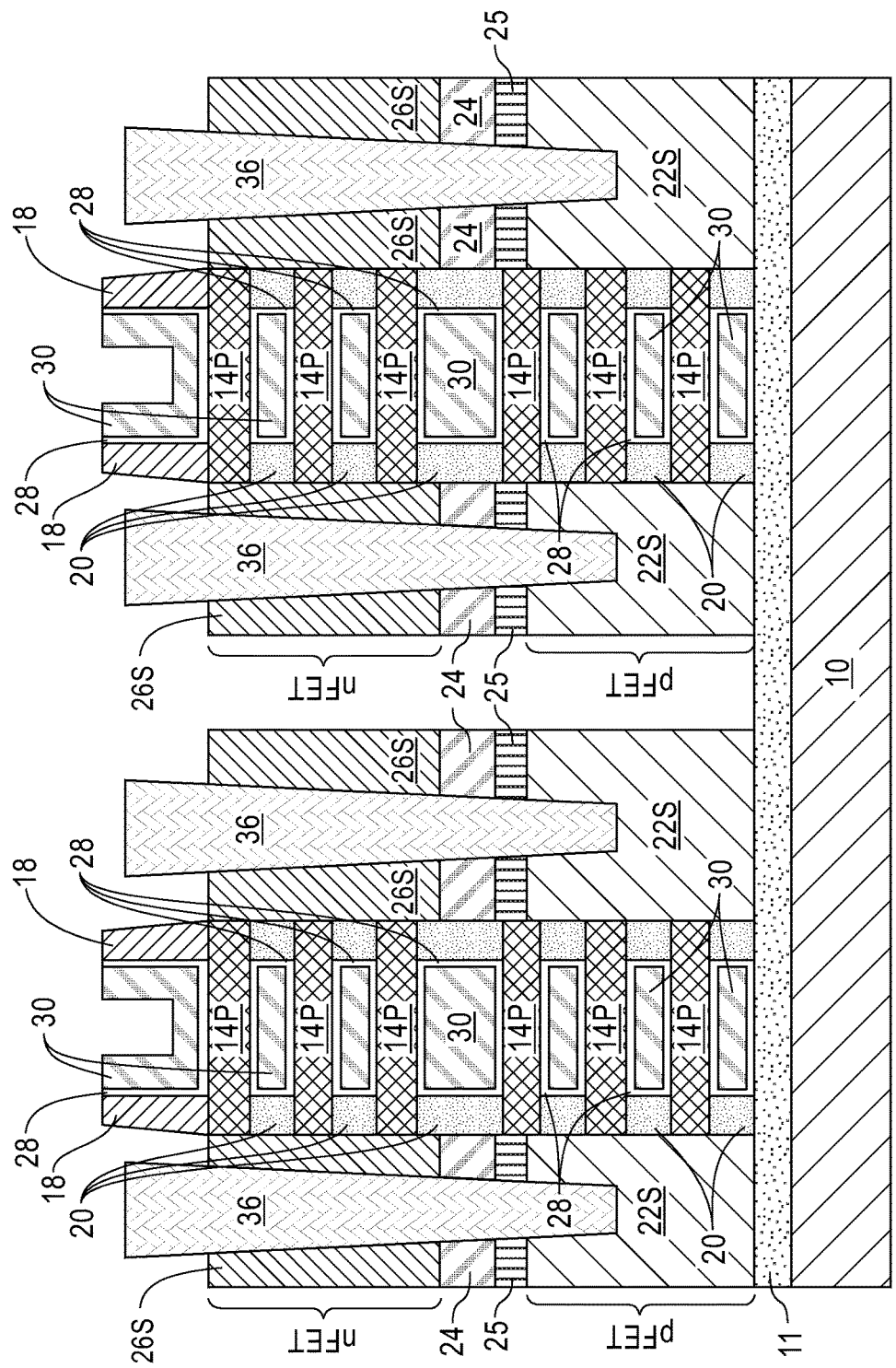
FIG. 10 is a cross sectional view of the exemplary semiconductor structure of FIG. 9A after forming first S/D contact structures in contact openings that are formed through the nFET S/D region, the silicon dioxide layer, the SiGe region and a portion of the maintained pFET S/D SiGe material.

Referring now to FIG. 10, there is illustrated the exemplary semiconductor structure of FIG. 9A after forming first S/D contact structures 36 in contact openings that are formed through the nFET S/D region 26S, the silicon dioxide layer 24, the SiGe region 25 and a portion of the FET S/D SiGe region 22S.

The contact openings can be formed by lithography and etching. The first S/D contact structures 36 can include a contact metal (such as, for example, W, Al or Cu) or metal alloy (such as, for example Cu—Al). The first S/D contact structures 36 can be formed by depositing a contact metal or metal alloy.

Figure 11:
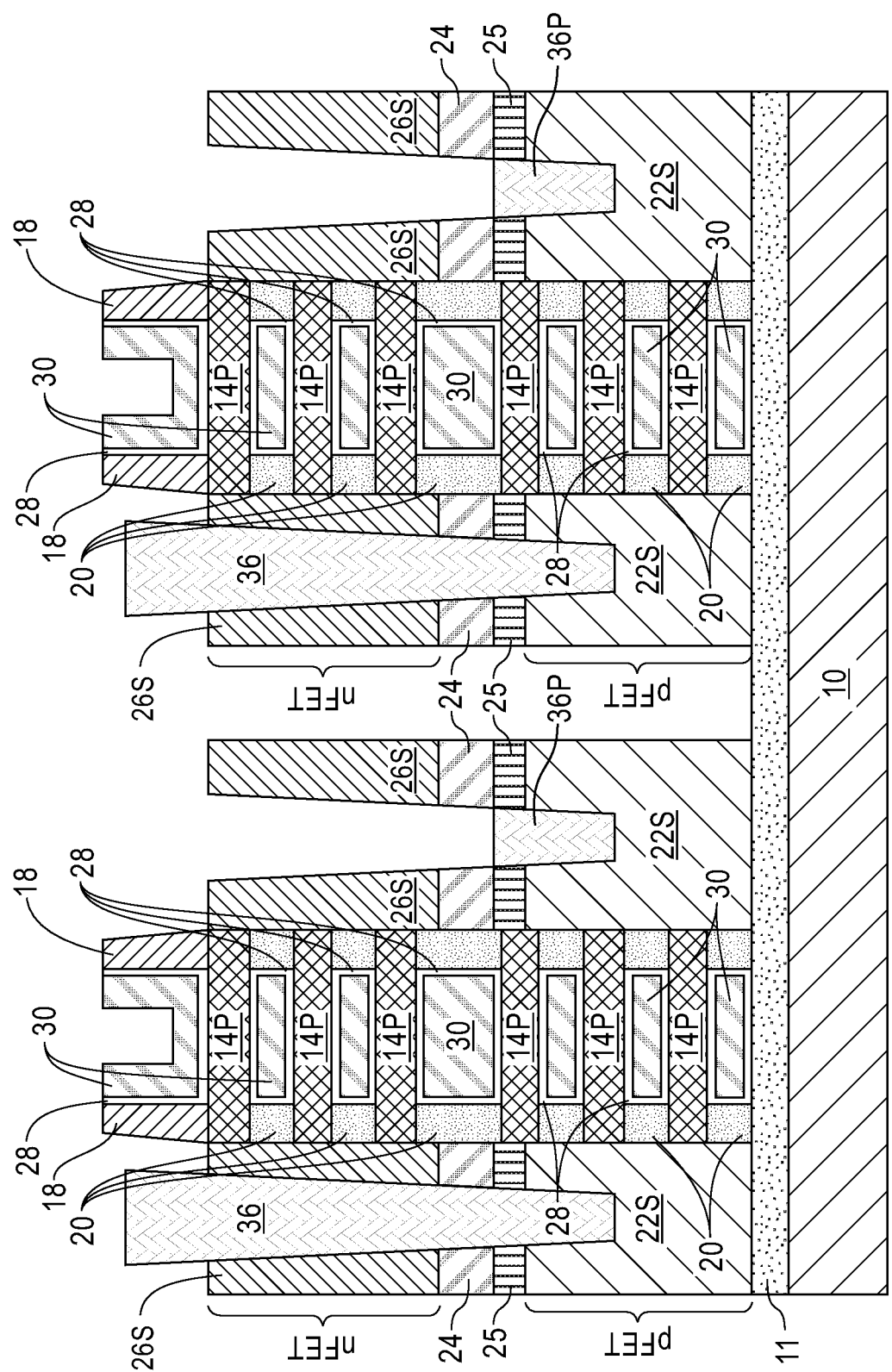
FIG. 11 is a cross sectional view of the exemplary semiconductor structure of FIG. 10 after removing the first S/D contact structure from an upper portion of a physically exposed first contact opening that is located on one side of the vertically stacked and suspended semiconductor channel material nanosheets.

Referring now to FIG. 11, there is illustrated the exemplary semiconductor structure of FIG. 10 after removing the first S/D contact structure 36 from an upper portion of a physically exposed first contact opening that is located on one side of the vertically stacked and suspended semiconductor channel material nanosheets 14P such that the upper portion of the first contact opening in the nFET device region is not filled at this point within any contact metal or metal alloy. A portion of the first S/D contact structure 36 remains in a bottom portion of the physically exposed first contact opening. The remaining portion of the first S/D contact structure 34 may be referred to herein as a pFET S/D contact structure 36P. As is shown, each pFET S/D contact structure 36P contacts exposed surfaces of SiGe region 25 and the pFET S/D SiGe region 22S.

This step of the present application may be performed by first providing a block mask over portions of the exemplary structure not including a first S/D contact structure 26 to further process. An etch is then performed to remove the first S/D contact structure 36 from an upper portion of each physically exposed first contact opening. In some embodiments, this step may be omitted.

Figure 12:
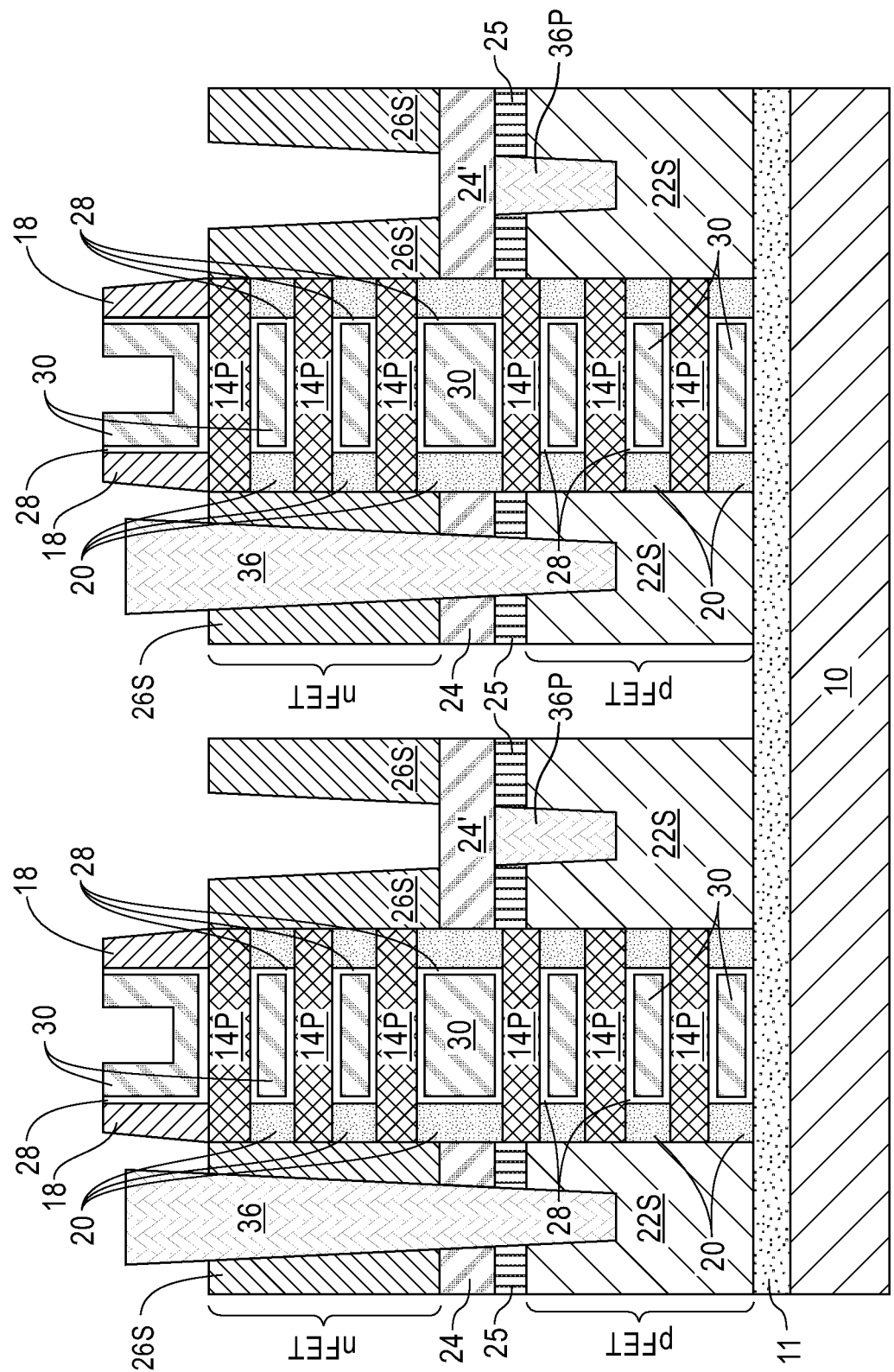
FIG. 12 is a cross sectional view of the exemplary semiconductor structure of FIG. 11 after forming additional dielectric material in the physically exposed first contact opening.

Referring now to FIG. 12, there is illustrated the exemplary semiconductor structure of FIG. 11 after forming additional dielectric material in the physically exposed first contact opening. The additional dielectric material is compositionally the same as the dielectric material that provides dielectric material 24. Since the original dielectric material 24 and the additional dielectric material are compositionally the same, reference numeral 24' is used to designate the original dielectric material 24 and the additional dielectric material that is formed during this step of the present application. The additional dielectric material may be formed utilizing one of the deposition techniques mentioned above for forming dielectric material 24. A recess etch may or may not follow the deposition of the additional dielectric material. The additional dielectric material may have a bottommost surface that is coplanar or located beneath a bottommost surface of dielectric material 24 and/or the additional dielectric material may have a topmost surface that is coplanar, located beneath, or located above a topmost surface of dielectric material 24.

Figure 13:
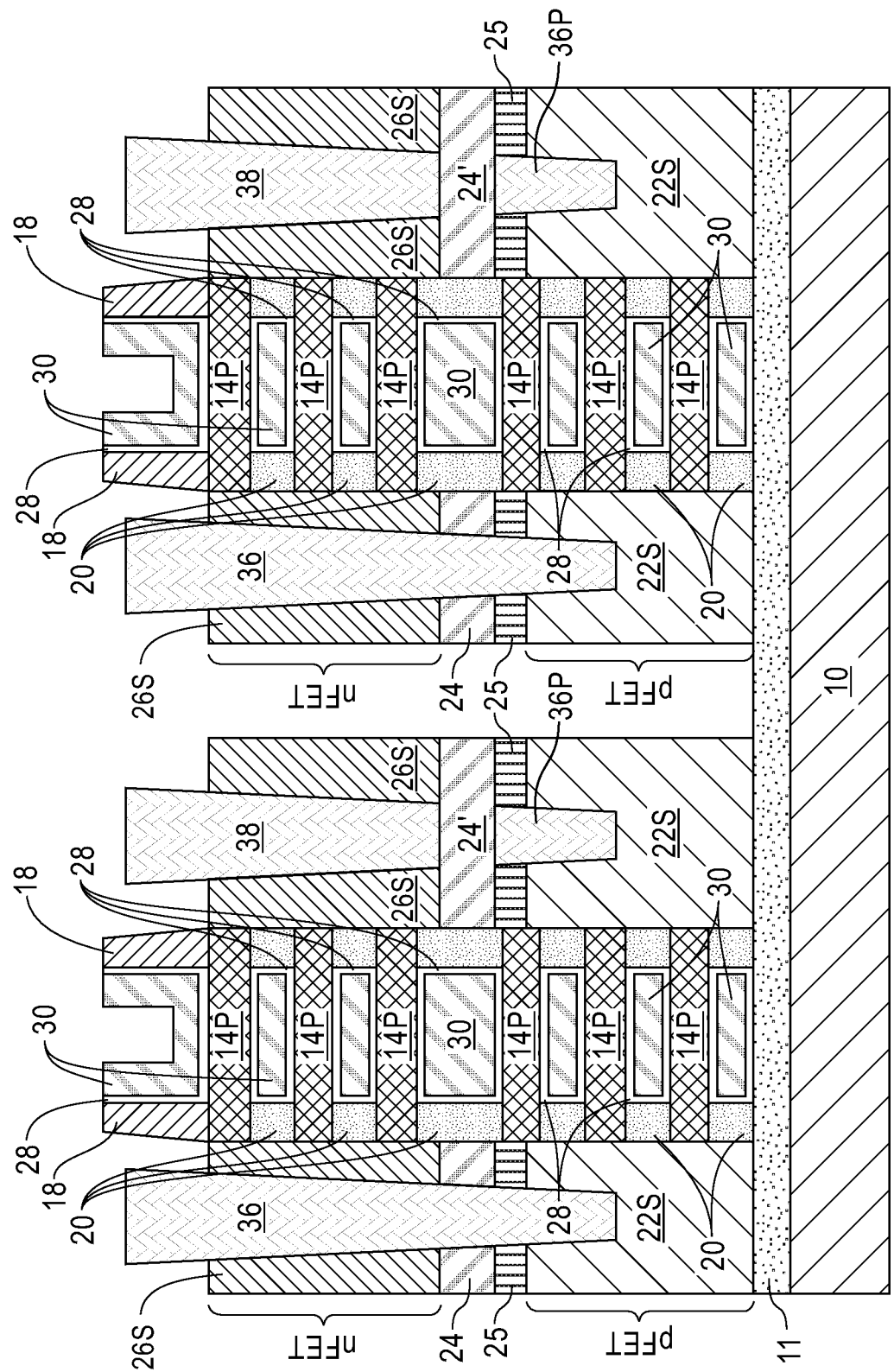
FIG. 13 is a cross sectional view of the exemplary semiconductor structure FIG. 12 after forming a second S/D contact structure in the physically exposed first contact opening and on the additional dielectric material.

Referring now to FIG. 13, there is illustrated the exemplary semiconductor structure FIG. 12 after forming a second S/D contact structure 38 in the physically exposed first contact opening and on the additional dielectric material 24'. The second S/D contact structure 38 may include one of the contact metals or metal alloys mentioned above for first S/D contact structure 36. The contact metal or metal alloy that provides the second S/D contact structure 38 may be the same as, or different from, the contact metal or metal alloy that provides the first S/D contact structure 36. The second S/D contact structure 38 can be formed by deposition. The second S/D contact structure 38 may be referred to herein an nFET S/D contact structure.

In the illustrated embodiment, the nFET S/D region 26S and the pFET S/D region 22S shown to the left of each vertically stacked and suspended semiconductor channel material nanosheet 14P share a common S/D contact structure, i.e., first contact structure 36. To the right of each vertically stacked and suspended semiconductor channel material nanosheet 14P, the nFET S/D region 26S has its' own contact structure, i.e., nFET S/D contact structure 38, while the pFET S/D structure (22S, 25) has its' own contact structure, i.e., pFET S/D contact structure 36P.

Figure 14:
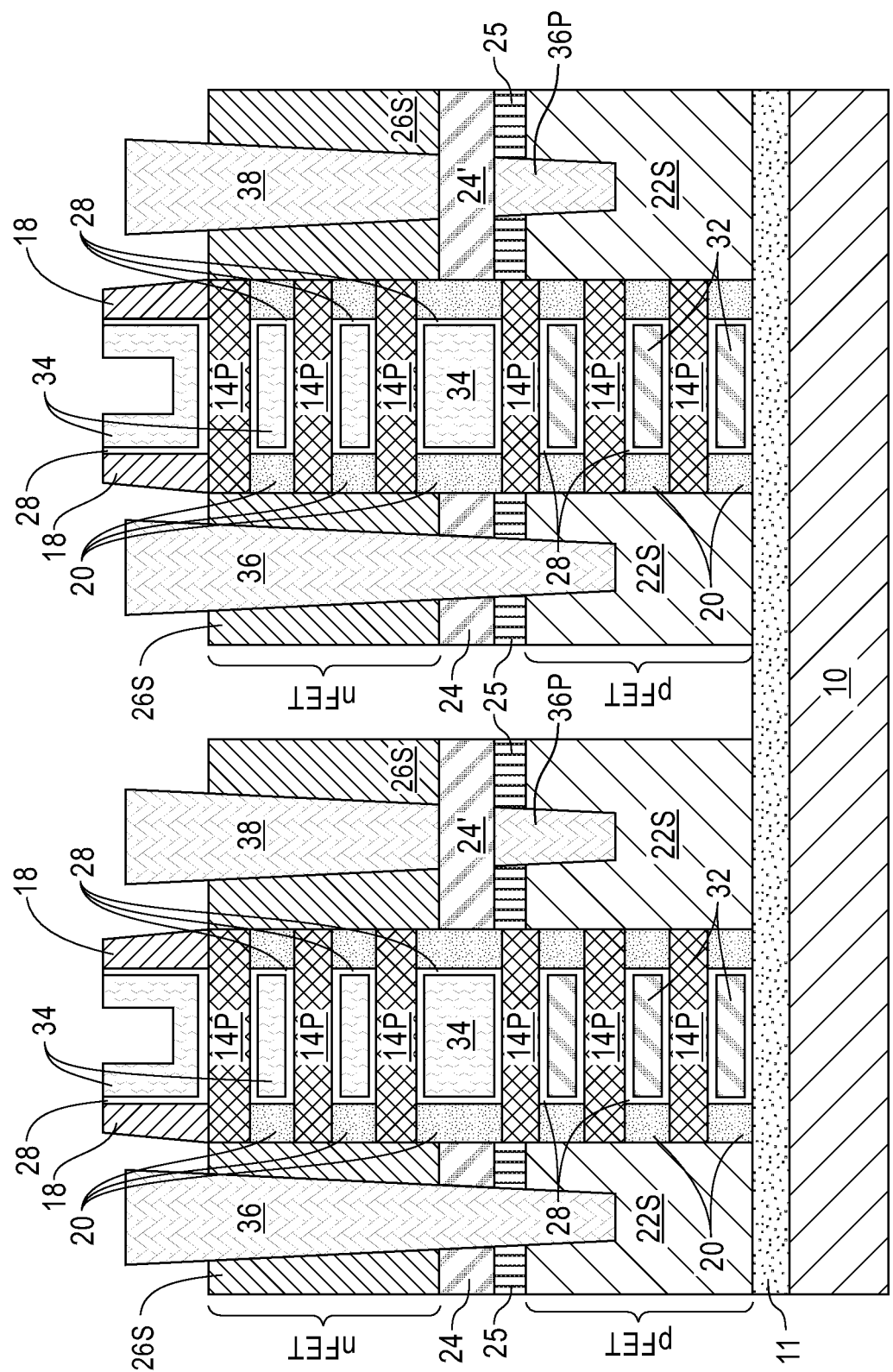
FIG. 14 is a cross sectional view of the exemplary semiconductor structure of FIG. 9B after forming S/D contact structures as shown in FIGS. 10-13 of the present application.

Referring now to FIG. 14, there is illustrated the exemplary semiconductor structure of FIG. 9B after forming S/D contact structures (36, 36P, 38) as shown in FIGS. 10-13 of the present application. The structure shown in FIG. 14 can be formed and include materials mentioned above in forming the S/D contact structures shown in FIGS. 10-13 of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   forming a vertical stack of a first nanosheet stack of alternating nanosheets of a sacrificial semiconductor nanosheet and a semiconductor channel material nanosheet, and a second nanosheet stack of alternating nanosheets of a sacrificial semiconductor nanosheet and a semiconductor channel material nanosheet, wherein the vertical stack is present above a semiconductor substrate and beneath a sacrificial gate structure and a dielectric spacer;
   recessing each sacrificial semiconductor nanosheet of the first and second nanosheet stacks;
   forming a p-type field effect transistor (pFET) source/drain (S/D) silicon germanium (SiGe) region having a first germanium (Ge) content on physically exposed sidewalls of each semiconductor channel material nanosheet of the first nanosheet stack;

forming a germanium oxide layer on at least physically exposed surfaces of each pFET S/D SiGe region;

performing a condensation anneal to convert an upper portion of each pFET S/D SiGe region into a SiGe region having a second germanium content that is greater than the first germanium content, wherein the germanium oxide layer located on each pFET S/D SiGe region is simultaneously converted into a silicon dioxide layer;

forming an n-type field effect transistor (nFET) source/drain (S/D) region on physically exposed sidewalls of each Si channel material nanosheet of the second nanosheet stack and on the silicon dioxide layer;

removing the sacrificial gate structure and each recessed sacrificial semiconductor nanosheet of the first and second nanosheet stacks to suspend each semiconductor channel material nanosheet and to provide a gate cavity; and forming a first functional gate structure in the gate cavity and on physically exposed surfaces of each suspended semiconductor channel material nanosheet of the first nanosheet stack, and forming a second functional gate structure in the gate cavity and on physically exposed surfaces of each suspended semiconductor channel material nanosheet of the second nanosheet stack.

2. The method of claim 1, further comprising forming an inner spacer on physically exposed sidewalls of each recessed sacrificial semiconductor nanosheet prior to the forming the pFET S/D SiGe region.

3. The method of claim 1, wherein the first and second functional gate structures each comprises a same work function metal.

4. The method of claim 1, wherein the first functional gate structure comprises a p-type work function metal and the second functional gate structure comprises an nFET functional gate structure.

5. The method of claim 1, wherein the condensation anneal is performed at a temperature of less than 800° C. and in an inert ambient.

6. The method of claim 1, further comprising forming a dielectric isolation layer on a surface of the semiconductor substrate and beneath the vertical stack of first and second nanosheet stacks prior to forming the pFET S/D SiGe region.

7. The method of claim 1, further comprising forming a shared S/D contact structure on a first side of the suspended semiconductor channel material nanosheets.

8. The method of claim 7, further comprising forming an nFET S/D contact structure and a pFET S/D contact structure located on a second side of the suspended semiconductor channel material nanosheets, opposite the first side, wherein the nFET S/D contact structure is present in the nFET S/D region and the pFET contact structure is present in the pFET S/D SiGe region.

9. The method of claim 1, wherein the forming of the pFET S/D SiGe region comprises an epitaxial growth process.

10. The method of claim 1, wherein the first germanium content is from 50 atomic percent to 60 atomic percent.

11. The method of claim 10, wherein the second germanium content is from 55 atomic percent to 75 atomic percent.

12. The method of claim 1, wherein each sacrificial semiconductor nanosheet of the first nanosheet stack and the second nanosheet stack is composed of a first semiconductor material that is resistant to Ge condensation.

13. The method of claim 12, wherein the first semiconductor material that provides each sacrificial semiconductor nanosheet of the first nanosheet stack and the second nanosheet stack is composed of a silicon germanium alloy having a germanium content of less than 50 atomic percent.

14. The method of claim 12, wherein each semiconductor channel material nanosheet of the first nanosheet stack and the second nanosheet stack is composed of a second semiconductor material that has a different etch rate than the first semiconductor material and is resistant to Ge condensation.

15. The method of claim 14, wherein the second semiconductor material is composed of a silicon germanium alloy having a germanium content of less than 50 atomic percent and the second semiconductor material differs from the first semiconductor material.

16. The method of claim 1, wherein the recessing of each sacrificial semiconductor nanosheet of the first and second nanosheet stacks comprises a lateral etching process.

17. The method of claim 1, wherein the forming of the nFET S/D region comprises an epitaxial growth process.

18. The method of claim 1, wherein the nFET S/D region has a height that is above a topmost surface of a topmost semiconductor channel material nano sheet of the second nanosheet stack.

19. The method of claim 1, wherein the nFET S/D region has a height that is coplanar with a topmost surface of a topmost semiconductor channel material nanosheet of the second nanosheet stack.

20. The method of claim 1, wherein the nFET S/D region has a height that is beneath a topmost surface of a topmost semiconductor channel material nanosheet of the second nanosheet stack, but not lower than a bottommost surface of the topmost semiconductor channel material nanosheet of the second nanosheet stack.

* * * * *